US007088768B2

(12) United States Patent
Kondo et al.

(10) Patent No.: US 7,088,768 B2
(45) Date of Patent: Aug. 8, 2006

(54) DATA PROCESSING APPARATUS AND DATA PROCESSING METHOD

(75) Inventors: Tetsujiro Kondo, Tokyo (JP); Naoki Kobayashi, Kanagawa (JP); Koji Ohta, Tokyo (JP)

(73) Assignee: Sony Corporation, Tokyo (JP)

( * ) Notice: Subject to any disclaimer, the term of this patent is extended or adjusted under 35 U.S.C. 154(b) by 28 days.

(21) Appl. No.: 10/804,266

(22) Filed: Mar. 18, 2004

(65) Prior Publication Data

US 2004/0174930 A1 Sep. 9, 2004

Related U.S. Application Data

(63) Continuation of application No. 09/434,788, filed on Nov. 5, 1999, now Pat. No. 6,728,310.

(30) Foreign Application Priority Data

Nov. 9, 1998 (JP) .................................. 10-317102

(51) Int. Cl.
*H04B 17/00* (2006.01)
(52) U.S. Cl. ....................................................... 375/224
(58) Field of Classification Search ................ 375/224, 375/225, 226, 295, 316, 219; 700/1, 90; 370/290, 291, 286, 282, 376; 379/406.08, 379/406.06, 406.01
See application file for complete search history.

(56) References Cited

U.S. PATENT DOCUMENTS

| 3,950,733 A | 4/1976 | Cooper et al. |
| 4,276,620 A | 6/1981 | Kahn et al. |
| 4,887,306 A | 12/1989 | Hwang et al. |
| 4,941,122 A | 7/1990 | Weideman |
| 5,038,388 A | 8/1991 | Song |
| 5,136,529 A | 8/1992 | Makie et al. |
| 5,263,120 A | 11/1993 | Bickel |
| 5,294,979 A | 3/1994 | Patel et al. |
| 5,295,061 A | 3/1994 | Katayama |
| 5,353,307 A | 10/1994 | Lester et al. |
| 5,402,520 A | 3/1995 | Schnitta |
| 5,408,588 A | 4/1995 | Ulug |
| 5,602,761 A | 2/1997 | Spoerre et al. |
| 5,684,720 A | 11/1997 | Hein |
| 5,692,011 A * | 11/1997 | Nobakht et al. ............. 375/233 |
| 5,694,342 A | 12/1997 | Stein |
| 5,774,633 A | 6/1998 | Baba |
| 5,802,220 A | 9/1998 | Black et al. |
| 5,812,993 A | 9/1998 | Ginosar |
| 5,835,901 A | 11/1998 | Duvoisin |

(Continued)

FOREIGN PATENT DOCUMENTS

EP 0 280 412 8/1988

(Continued)

*Primary Examiner*—Pankaj Kumar
(74) *Attorney, Agent, or Firm*—Frommer Lawrence & Haug LLP; William S. Frommer

(57) ABSTRACT

A data processing apparatus processes input data and outputs the processed data. The data processing apparatus includes a data processing section for processing the input data by a predetermined processing method and outputting the processed data, an input-data evaluation section for evaluating the input data, an output-data evaluation section for evaluating the output data, and a real-time learning section for controlling such that the processing method is learned in real time according to the evaluation results obtained by the input-data evaluation section and the output-data evaluation section and the data processing section processes the input data according to the learned processing method, and thereby, improves the output data every moment.

15 Claims, 14 Drawing Sheets

U.S. PATENT DOCUMENTS

| | | |
|---|---|---|
| 5,875,216 A | 2/1999 | Martin |
| 5,909,178 A | 6/1999 | Balch et al. |
| 5,920,599 A | 7/1999 | Igarashi |
| 5,963,447 A | 10/1999 | Kohn et al. |
| 6,034,734 A | 3/2000 | De Haan et al. |
| 6,064,997 A | 5/2000 | Jagannathan et al. |
| 6,115,433 A | 9/2000 | de Lantremange |
| 6,157,403 A | 12/2000 | Nagata |
| 6,233,365 B1 | 5/2001 | Teruhiko |
| 6,247,002 B1 | 6/2001 | Steels |
| 6,278,961 B1 | 8/2001 | Kadtke et al. |
| 6,285,710 B1 | 9/2001 | Hurst, Jr. et al. |

FOREIGN PATENT DOCUMENTS

| | | |
|---|---|---|
| EP | 0 821 322 | 1/1998 |
| EP | 0 847 054 | 6/1998 |
| JP | 09/319866 A | 9/1997 |

\* cited by examiner

FIG. 10
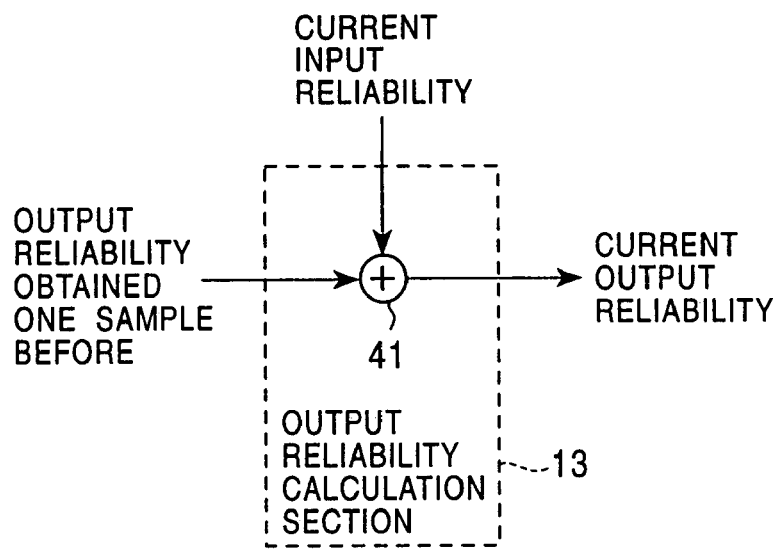
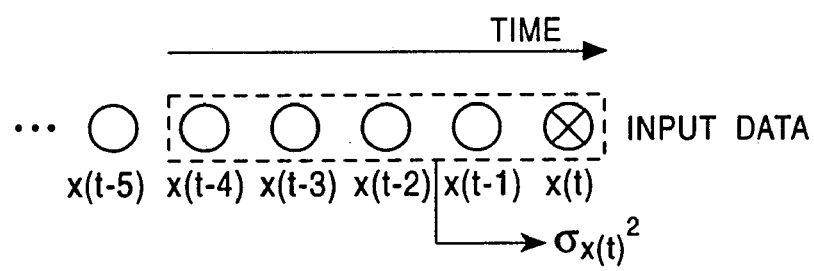
FIG. 11A
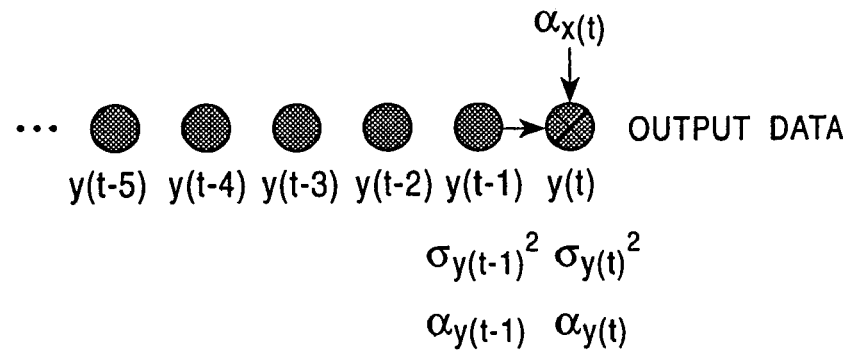
FIG. 11B

DATA PROCESSING APPARATUS AND DATA PROCESSING METHOD

This application is a continuation of U.S. application Ser. No. 09/434,788, filed Nov. 5, 1999 now U.S. Pat. No. 6,728,310.

BACKGROUND OF THE INVENTION

1. Field of the Invention

The present invention relates to data processing apparatuses and data processing methods, and more particularly, to a data processing apparatus and a data processing method which allow noise included in data to be removed more effectively.

2. Description of the Related Art

In general, data such as transmitted or reproduced image data and sound data includes noise which changes as time elapses. To remove the noise included in the data, there have been known methods in which the average, namely, the whole average, of the whole input data is obtained and in which the average of a part of the input data, which is called a moving average, is obtained.

The method in which the whole average is calculated is effective when the degree of noise included in data, namely, the signal-to-noise ratio (SIN ratio) of the data, is uniform. When the S/N ratio of data varies, however, a portion of the data having a low S/N ratio affects a portion of the data having a high S/N ratio to make it difficult to remove the noise effectively in some cases.

In the method in which the moving average is calculated, since the average of data positioned close to the current input data in the time domain is obtained, the processing result is affected by a change in the S/N ratio of the data. In other words, the processing result has a high S/N ratio for a portion of the data having a high S/N ratio, but the processing result has a low S/N ratio for a portion of the data having a low S/N ratio.

SUMMARY OF THE INVENTION

Accordingly, it is an object of the present invention to solve the foregoing drawbacks.

The foregoing object is achieved in one aspect of the present invention through the provision of a data processing apparatus for processing input data and outputting the processed data, including: a data processing section for processing the input data by a predetermined processing method and outputting the processed data; an input-data evaluation section for evaluating the input data; an output-data evaluation section for evaluating the output data, and a real-time learning section for controlling such that the processing method is learned in real time according to the evaluation results obtained by the input-data evaluation section and the output-data evaluation section and the data processing section processes the input data according to the learned processing method.

The foregoing object is achieved in another aspect of the present invention through the provision of a data processing method for processing input data and outputting the processed data, including: a data processing step for processing the input data by a predetermined processing method and outputting the processed data; an input-data evaluation step for evaluating the input data; an output-data evaluation step for evaluating the output data, and a real-time learning step for controlling such that the processing method is learned in real time according to the evaluation results obtained in the input-data evaluation step and the output-data evaluation step and the input data is processed in the data processing step by the learned processing method.

BRIEF DESCRIPTION OF THE DRAWINGS

FIG. 10 is a block diagram showing an example structure of an output reliability calculation section 13 shown in FIG. 7.

FIG. 11A is a view showing the processing of input data in the NR processing circuit shown in FIG. 7.

FIG. 11B is a view showing the processing of output data in the NR processing circuit shown in FIG. 7.

DESCRIPTION OF THE PREFERRED EMBODIMENT

Figure 1:
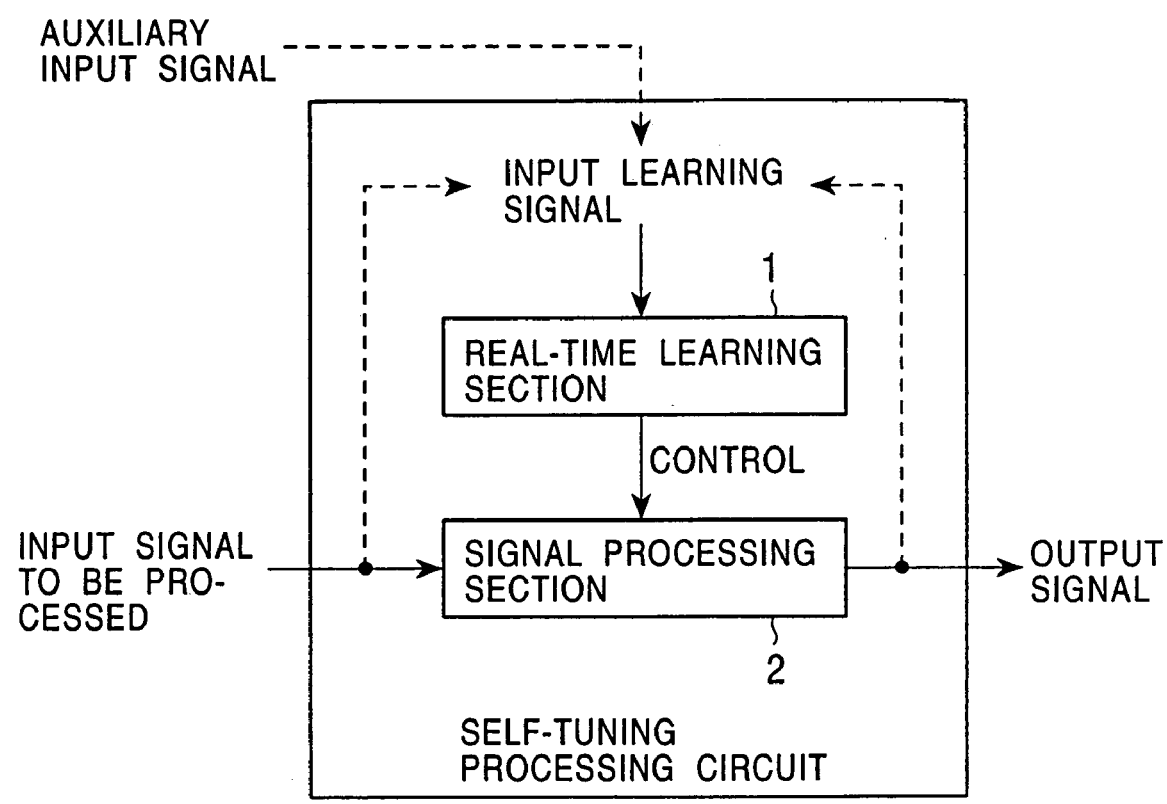
FIG. 1 is a block diagram of a self-tuning processing circuit according to an embodiment of the present invention.

An embodiment of the present invention will be described below by referring to the drawings.

FIG. 1 shows an example structure of a self-tuning processing circuit according to an embodiment of the present invention.

In this self-tuning processing circuit, an input signal (for example, digital data) to be processed is processed by the most appropriate processing method, and the result of the processing is output as an output signal.

The self-tuning processing circuit is formed of a real-time learning section 1 and a signal processing section 2.

The real-time learning section 1 receives a learning input signal used for learning the processing method by which the input signal to be processed is processed. The real-time learning section 1 controls the signal processing section 2 such that the processing method is learned in real time-according to the learning input signal and the processing method obtained as the result of the learning is used for processing, in order to adaptively process the input signal to be processed so that the output signal is improved as time elapses.

The signal processing section 2 adaptively processes the input signal to be processed by the processing method specified by the real-time learning section 1, and outputs the result of the processing as an output signal.

Therefore, since the signal processing section 2 processes the input signal to be processed by the use of the processing method learned in real time as described above, the input signal to be processed is adaptively processed and thereby the output signal, which is obtained by adaptively processing the input signal to be processed, is improved as time elapses.

More specifically, the processing method by which the signal processing section 2 processes the input signal to be processed is improved by real-time learning in the real-time learning section 1. The signal processing section 2 adaptively processes the input signal to be processed by the use of the processing method specified by the real-time learning section 1. As time elapses or as the amount of input signal processed increases, a so-called learning effect gradually appears, and the output signal output from the signal processing section 2 is improved as time elapses. The improvement of the output signal means that the processing method of the signal processing section 2 is improved as time elapses.

As described above, in the self-tuning processing circuit, the processing method for the input signal to be processed is learned in real time and the processing is executed by the processing method obtained as the result of the learning such that the output signal is improved as time elapses. In other words, as the learning proceeds, the processing appropriate for the input signal to be processed is applied to itself. Therefore, the processing which the self-tuning processing circuit shown in FIG. 1 performs can be called self-tuning processing.

An improvement of the output signal means, for example, an image-quality improvement when the input signal to be processed is an image. More specifically, it means an improvement of the S/N ratio or resolution. When the purpose of the processing in the signal processing section 2 is applying an effect, such as smoothing or edge emphasis, the improvement of the output signal means that the effect greatly appears. Therefore, the improvement of the output signal means that the output signal is changed to that having a state which the user desires.

The real-time learning section 1 learns in real time the processing method used for processing the input signal to be processed, according to the input learning signal input to the section. As shown by dotted lines in FIG. 1, the input learning signal can be the input signal to be processed, input to the signal processing section 2, the output signal output from the signal processing section 2, or further, an auxiliary input signal sent to the self-tuning processing circuit to perform learning of the processing method applied to the input signal to be processed. Two or more of the above signals may be used as input learning signals.

In the self-tuning processing circuit, the processing method of the signal processing section 2 is improved every moment when the real-time learning section 1 learns in real time. Therefore, the self-tuning processing circuit is a so-called change-with-time system. The improvement of the processing method is achieved in two cases: a case in which the algorithm of the processing is changed and a case in which the contents of processing steps constituting the series of processing or those of elements constituting the processing are changed.

When "x" indicates the input signal to be processed and "y" indicates an output signal, for example, the processing in the signal processing section 2 is expressed by an expression of y=f(x) with the use of a function "f( )".

Figure 2A:
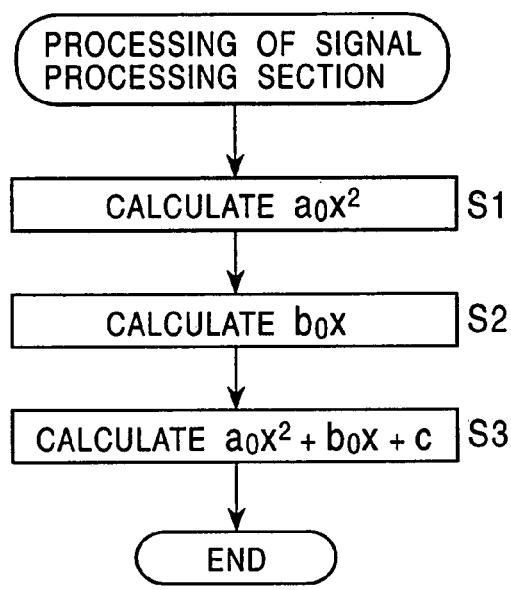
FIG. 2A is a flowchart of a processing method used before an algorithm is changed.

When the expression is set to "$f(x)=a_0x^2+b_0x+c_0$," for example, the processing of the signal processing section 2 used before the algorithm is changed can be expressed by a flowchart shown in FIG. 2A.

In a step S1, $a_0x^2$ is calculated. In a step S2, $b_0x$ is calculated. Then, in a step S3, $a_0x^2+b_0x+c_0$ is calculated to obtain the output signal "y."

In this case, changing the form of the function "f(x)" corresponds to changing the algorithm of the processing. More specifically, changing the function from "$f(x)=a_0x^2+b_0x+c_0$" to "$f(x)=(a_0x^2+b_0x+c_0)^2$," for example, corresponds to changing the algorithm of the processing.

Figure 2B:
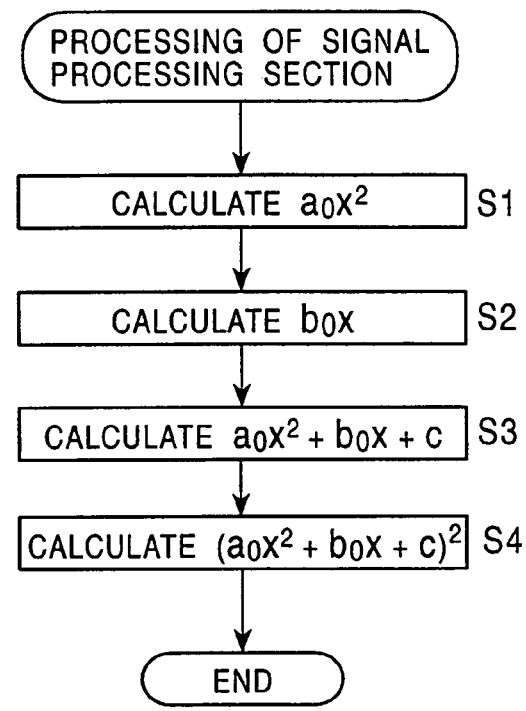
FIG. 2B is a flowchart of a processing method used after the algorithm is changed.

In this case, the processing of the signal processing section 2 used after the algorithm is changed can be expressed, for example, by a flowchart shown in FIG. 2B.

Specifically, in steps S1 to S3, the same processing as that shown in FIG. 2A is executed, and $(a_0x^2+b_0x+c_0)^2$ is calculated to obtain the output signal "y."

As clearly understood from the comparison between the flowchart shown in FIG. 2A and that shown in FIG. 2B, when the algorithm of the processing is changed, the flowchart which expresses the processing is also changed accordingly.

Changing a coefficient of the function "f(x)" corresponds to changing the contents of an element constituting the processing. Specifically, for example, changing the function from "$f(x)=a_0x^2+b_0x+c_0$" to "$f(x)=a_1x^2+b_1x+c_1$," corresponds to changing the contents of the elements constituting the processing.

Figure 3A:
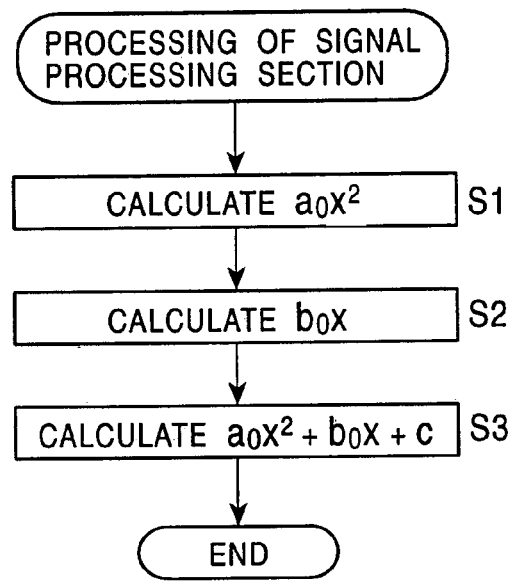
FIG. 3A is a flowchart of a processing method used before processing elements are changed.
Figure 3B:
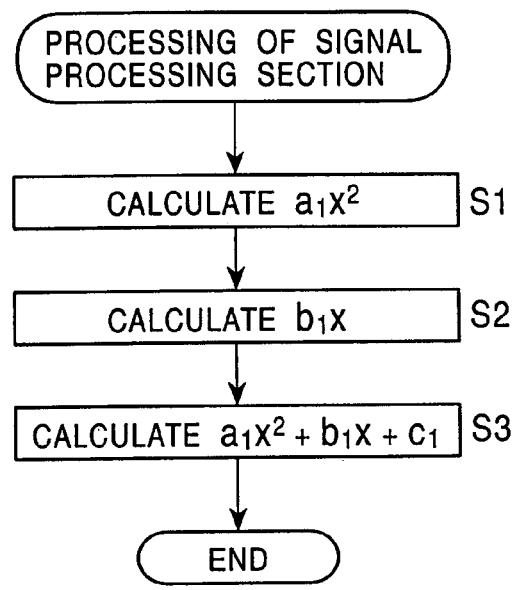
FIG. 3B is a flowchart of a processing method used after the processing elements are changed.

In this case, the processing of the signal processing section 2 is changed from the processing shown by a flowchart in FIG. 3A, which is the same as that shown in FIG. 2A, to, for example, the processing shown by a flowchart in FIG. 3B.

Specifically, in this case, $a_1x^2$ is calculated in a step S1, $b_1x$ is calculated in a step S2, and then, $a_1x^2+b_1x+c_1$ is calculated in a step S3 to obtain the output signal "y."

As clearly understood from the comparison between the flowchart shown in FIG. 3A and that shown in FIG. 3B, when the coefficients of the function "f(x)" are changed, the contents of steps constituting the processing are changed accordingly. Specifically, in FIGS. 3A and 3B, the contents of the step S1 is changed from the calculation of $a_0x^2$ to that of $a_1x^2$, the contents of the step S2 is changed from the calculation of $b_0x$ to that of $b_1x$, the contents of the step S3 is changed from $a_0x^2+b_0x+c_0$ to $a_1x^2+b_1x+c_1$.

In some cases, the processing method is improved both by changing the algorithm of the processing and by changing the contents of an element constituting the processing.

The functions used in FIGS. 2A and 2B and FIGS. 3A and 3B are just examples used to describe an improvement of the processing method. Whether the output signal is actually improved is irrelevant to the fact that the function expressing the processing of the signal processing section 2 is changed as described above.

The self-tuning processing circuit differs, for example, from conventional digital filters in that the coefficients of the function f(x) are changed by real-time learning, namely, according to newly generated adaptive coefficients. Specifically, in the conventional digital filters, a tap coefficient may be changed according to input data to a coefficient prepared in advance, which is not generated by real-time learning. In other words, in the conventional digital filters, a tap coefficient which the system designer thinks is appropriate for input data is selected among tap coefficients prepared in advance. A tap coefficient adaptive to input data is not obtained. As a result, even if a tap coefficient more appropriate for the input data exists, it cannot be used unless it is prepared in advance. Therefore, the above conventional digital filters are called in some cases systems changing a tap coefficient "adaptively," but accurately speaking, it is not "adaptively" but "selectively." They are systems in which a tap coefficient adaptive to input data is not generated but a tap coefficient selected uniquely against the input data is used.

In contrast, in the self-tuning processing circuit, a tap coefficient is generated by real-time learning such that input data is adaptively processed. In other words, the input data is processed with the most appropriate tap coefficient. More specifically, for example, whereas in the conventional digital filters, for example, when two sets of tap coefficients are prepared in advance, one of the two sets of tap coefficients which the system designer thinks is appropriate for the input data is uniquely selected and used. Tap coefficients used for processing the input data are improved every moment by real-time learning to obtain tap coefficients more appropriate for the input data, and processing is executed with the use of such tap coefficients in the self-tuning processing circuit. Therefore, processing adaptive to the input data is executed.

In addition, the self-tuning processing circuit differs from conventional processing which applies adaptive processing to input data but output data is not improved every moment, such as adaptive dynamic range coding (ADRC) processing, in that output data is improved every moment. Specifically, in the ADRC processing, the maximum value MAX and the minimum value MIN of the pixel values of pixels constituting a block in an image are detected, and the pixel values of the pixels constituting the block are re-quantized in K bits according to a local dynamic range DR obtained by MAX—MIN in the block. More specifically, the minimum value MIN is subtracted from the value of each pixel in the block and the difference is divided by $DR/2^K$ for requantization. Therefore, adaptive processing is applied to input data in that the quantization step $DR/2^K$ of the pixel values is obtained according to the block dynamic range DR and the pixel values are quantized by the quantization step $DR/2^K$, but output data obtained as the quantization results is not improved every moment.

The real-time learning section 1 uses all the sample values of input learning signals obtained so far in order to improve the output signal as time elapses in real-time learning at the current time "t." The output signal of the signal processing section 2 may be more effectively improved if the real-time learning section 1 gives a weight to sample values of input learning signals obtained at positions close in a time manner to the current time "t" and sample values obtained at positions far from the current time are not used much. Therefore, the real-time learning section 1 can execute real-time learning such that the above-described weight is given to input learning signals, namely, the sample values of input learning signals obtained at positions in a time manner far from the current time "t" are ignored according to the rates corresponding to the degrees of the time differences. Alternatively, the real-time learning section 1 can use only input learning signals obtained within a predetermined time period from the current time "t." Specifically, for example, as shown in FIG. 4, the real-time learning section 1 is configured such that only input learning signals within four samples from the current time "t" is used for real-time learning at the current time "t." This can be implemented by applying a weight of zero to input learning signals away from the current time "t" by five or more sample periods.

Figure 4:
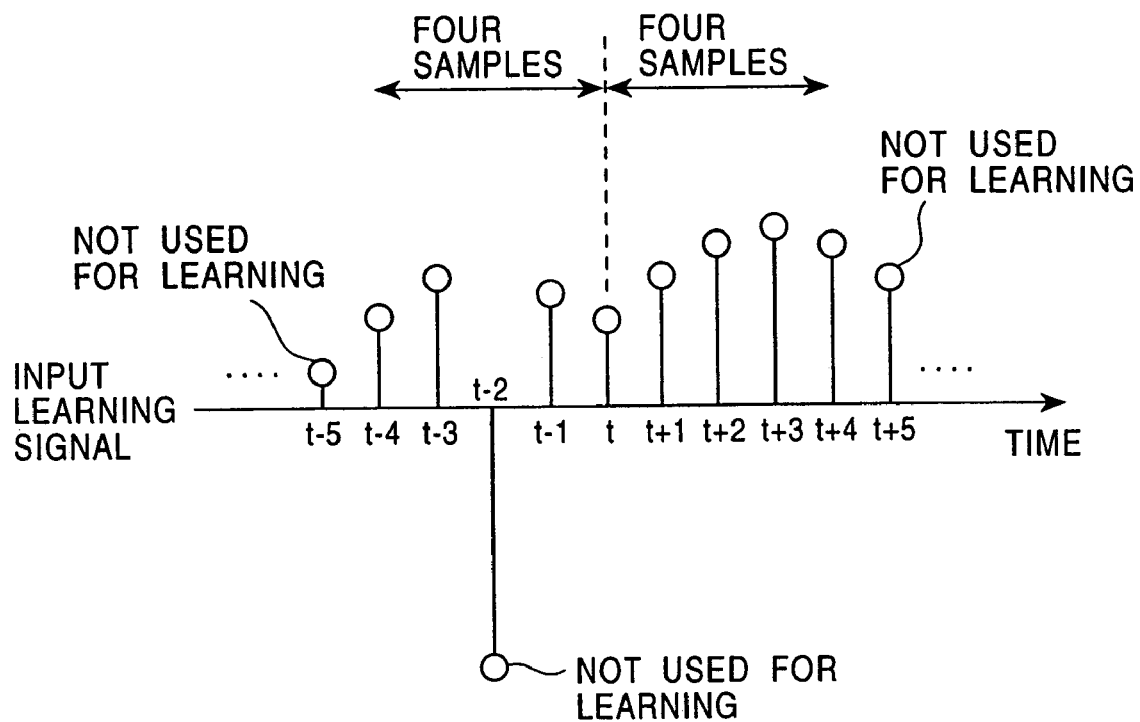
FIG. 4 is a view showing input learning data used for learning.

In real-time learning at the current time "t," the real-time learning section 1 can use only sample values within a predetermined range in magnitude from the sample value of the input learning signal obtained at the current time "t." Specifically, for example, in FIG. 4, a sample value, such as the sample value of the input learning signal obtained at the time "t−2," having a magnitude largely different from that of the sample value of the input learning signal obtained at the current time "t" may adversely affect learning. Therefore, it is possible not to use, namely, to give a weight of zero to, a sample value having a magnitude largely different from that of the input learning signal obtained at the current time "t" in real-time learning at the current time "t," in the real-time learning section 1.

Figure 5:
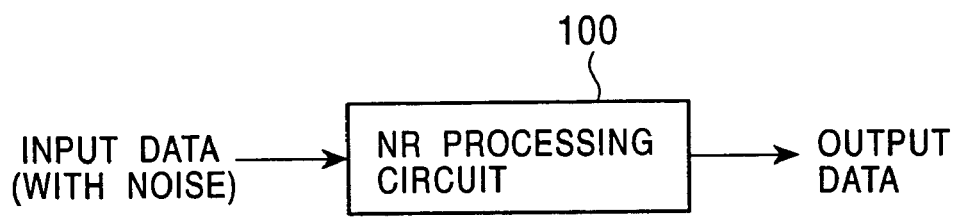
FIG. 5 is a block diagram showing an example structure of a noise reduction (NR) processing circuit according to the present invention.

FIG. 5 shows an example structure of a noise reduction (NR) processing circuit 100 to which the self-tuning processing circuit shown in FIG. 1 is applied.

In this NR processing circuit 100, when data having noise is input to the NR processing circuit 100, self-tuning processing is applied to the input data and data obtained by effectively removing the noise from the input data is output.

Figure 6A:
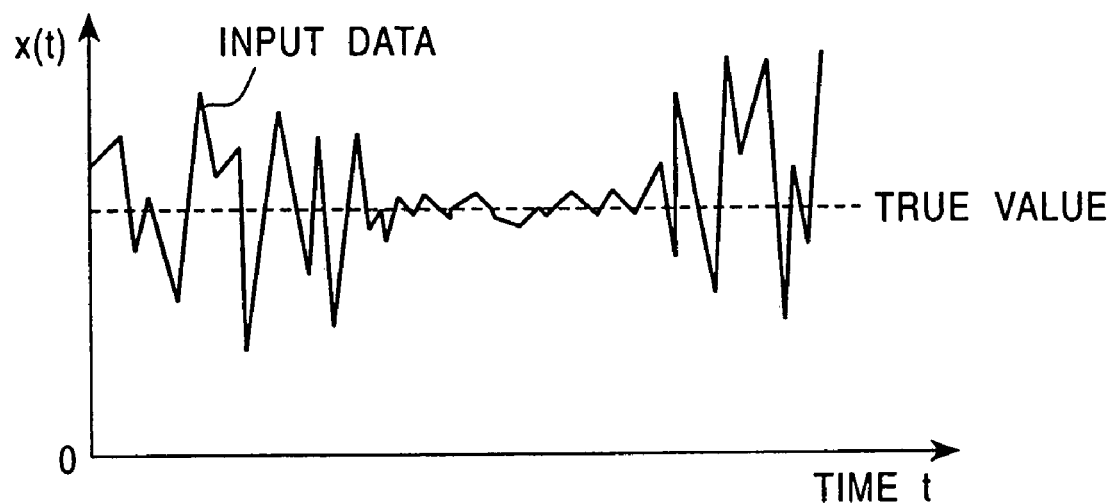
FIG. 6A is a view showing the input data to be processed by the NR processing circuit shown in FIG. 5.

Specifically, for example, to simplify a description, a case is examined in which input data having a constant true value and on which noise fluctuating in time is superposed, as shown in FIG. 6A, is averaged to remove the noise fluctuating in time. The noise is effectively removed by setting a weight for input data having a large noise level, namely, having a low S/N ratio, to a small value and by setting a weight for input data having a small noise level, namely, having a high S/N ratio, to a large value.

Figure 6B:
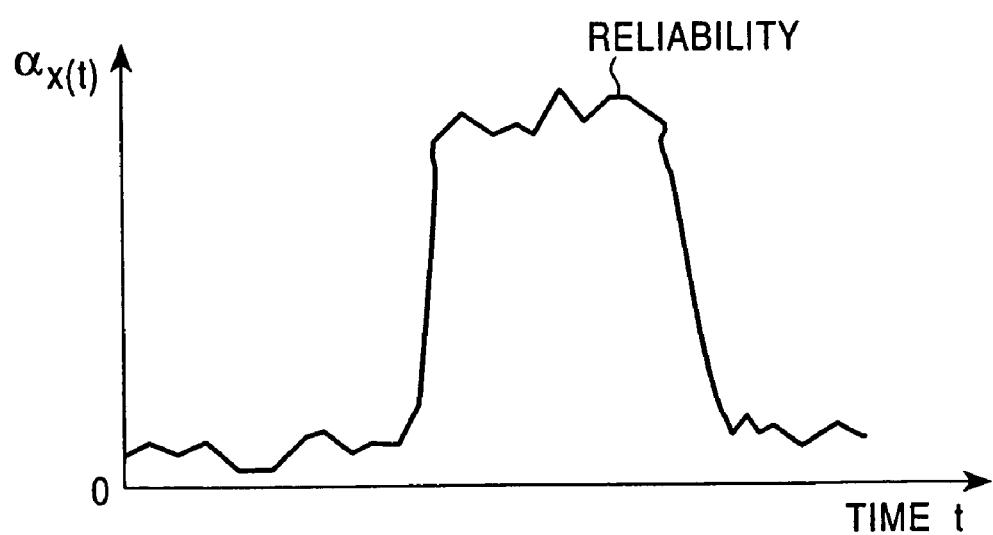
FIG. 6B is a view showing the reliability of the input data to be processed by the NR processing circuit shown in FIG. 5.

In the NR processing circuit 100, as the evaluation value of input data, the degree of reliability indicating how the input data is close to the true value, which is the reliability of the input data against the true value, for example, shown in FIG. 6B, is obtained by real-time learning. The NR processing circuit 100 calculates its average while the weight corresponding to the reliability is applied to the input data, to effectively remove the noise.

Therefore, the NR processing circuit 100 obtains a weighted average of the input data by the use of the weight corresponding to its reliability and outputs it as output data. The output data y(t) is obtained from the following expression, where x(t), y(t), and $\alpha_{x(t)}$ indicate the input data, the output data, and the reliability of the input data at the time "t" in the NR processing circuit 100, respectively.

$$y(t) = \frac{\sum_{i=0}^{t} \alpha_{x(i)} x(i)}{\sum_{i=0}^{t} \alpha_{x(i)}} \quad (1)$$

It is assumed here that a larger weight is given to the higher degree of reliability $\alpha_{x(t)}$ of input data.

The output data "y(t−1)," obtained one sample before the current time "t," is calculated as follows from the expression (1)

$$y(t-1) = \frac{\sum_{i=0}^{t-1} \alpha_{x(i)} x(i)}{\sum_{i=0}^{t-1} \alpha_{x(i)}} \quad (2)$$

As for the output data y(t), the degree of reliability $\alpha_{y(t)}$ indicating how the output data y(t) is close to the true value, which is the reliability of the output data y(t) against the true value, is introduced as an evaluation value of the output data y(t). The reliability $\alpha_{y(t-1)}$ of the output data y(t−1), obtained one sample before the current time "t," is defined by the following expression.

$$\alpha_{y(t-1)} = \sum_{i=0}^{t-1} \alpha_{x(i)} \quad (3)$$

In this case, the output data "y(t)" and its reliability $\alpha_{y(t)}$ are expressed as follows with the use of the expressions (1) to (3).

$$y(t) = \frac{\overbrace{\alpha_{y(t-1)}}^{\sum_{i=0}^{t-1} \alpha_{x(i)} x(i) + \alpha_{x(t)} x(t)}}{\underbrace{\sum_{i=0}^{t-1} \alpha_{x(i)} + \alpha_{x(t)}}_{\alpha_{y(t-1)}}} \quad (4)$$

$$= \frac{\alpha_{y(t-1)} y(t-1) + \alpha_{x(t)} x(t)}{\alpha_{y(t-1)} + \alpha_{x(t)}}$$

$$\alpha_{y(t)} = \alpha_{y(t-1)} + \alpha_{x(t)}$$

The weight used to obtain the output data y(t) at the time "t" is indicated by w(t), and defined by the following expression.

$$w(t) = \alpha_{y(t-1)} / (\alpha_{y(t-1)} + \alpha_{x(t)}) \quad (5)$$

From the expression (5), the following expression is satisfied.

$$1 - w(t) = \alpha_{x(t)} / (\alpha_{y(t-1)} + \alpha_{x(t)}) \quad (6)$$

With the use of the expressions (5) and (6), the output data y(t) in the expression (4) can be expressed in the following way by a weighted average obtained by multiplications and an addition.

$$y(t) = w(t) y(t-1) + (1 - w(t)) x(t) \quad (7)$$

The weights w(t) and 1−w(t) used in the expression (7) can be obtained from the expression (5) with the use of the reliability $\alpha_{y(t-1)}$ of the output data y(t−1) obtained one sample before and the reliability $\alpha_{x(t)}$ of the current input data x(t). The reliability $\alpha_{y(t)}$ of the current output data y(t) in the expression (4) can also be obtained with the use of the reliability $\alpha_{y(t-1)}$ of the output data y(t−1) obtained one sample before and the reliability $\alpha_{x(t)}$ of the current input data x(t).

When the reliability $\alpha_{x(t)}$ of the input data x(t) and the reliability $\alpha_{y(t)}$ of the output data y(t) are expressed, respectively, by the reciprocals of the corresponding dispersions $\sigma_{x(t)}^2$ or $\sigma_{y(t)}^2$, in other words, when the reliability $\alpha_{x(t)}$ and the reliability $\alpha_{y(t)}$ are set as follows, $$\alpha_{x(t)} = 1/\sigma_{x(t)}^2$$

$$\alpha_{y(t)} = 1/\sigma_{y(t)}^2 \quad (8)$$

the weight w(t) in the expression (7) can be obtained by the following expression.

$$w(t) = \sigma_{x(t)}^2 / (\sigma_{y(t-1)}^2 + \sigma_{x(t)}^2) \quad (9)$$

In this case, 1−w(t) in the expression (7) can be obtained by the following expression.

$$1 - w(t) = \sigma_{y(t-1)}^2 / (\sigma_{y(t-1)}^2 + \sigma_{x(t)}^2) \quad (10)$$

A term, $\sigma_{y(t)}^2$, can be obtained by the following expression.

$$\sigma_{y(t)2} = w(t)^2 \sigma_{y(t-1)}^2 + (1-w(t))^2 \sigma_{x(t)}^2 \quad (11)$$

The NR processing circuit 100 shown in FIG. 5 learns in real time the weight w(t) according to the expression (5) and 1−w(t) according to the expression (6), with the input data x(t) and the output data y(t) being used as input learning signals. The NR processing circuit calculates the weighted average of the output data y(t−1) obtained one sample before and the current input data x(t) according to the expression (7) with the use of the weight w(t) obtained as a result of the real-time learning to adaptively process the input data x(t) so that the noise included in the input data x(t) is effectively removed. In other words, the S/N ratio of the output data y(t) output from the NR processing circuit 100 is improved as time elapses.

Figure 7:
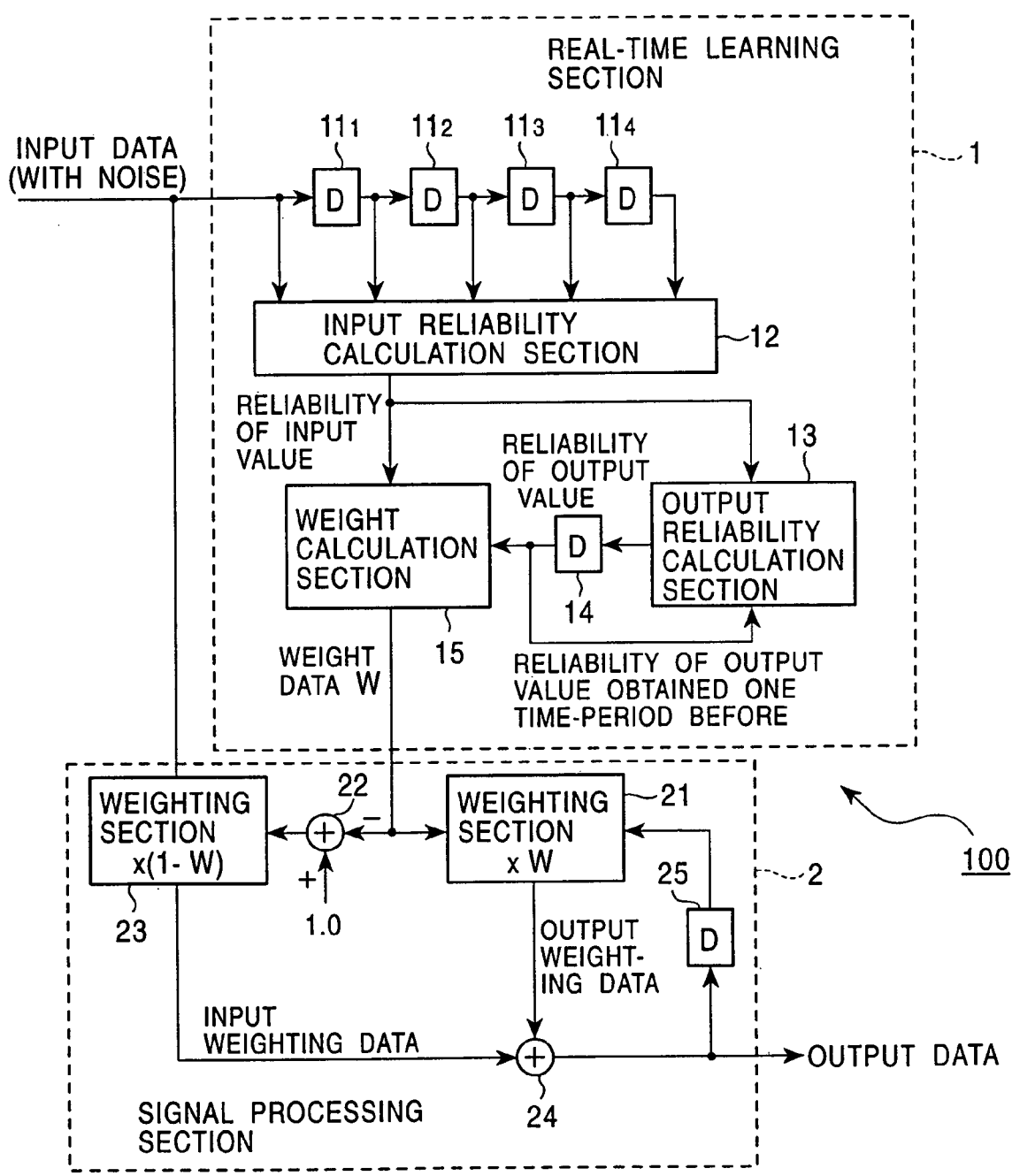
FIG. 7 is a block diagram showing an example structure of the NR processing circuit shown in FIG. 5.

FIG. 7 shows an example structure of such an NR processing circuit 100.

A latch circuit 11₁, receives data. The latch circuit 11₁ latches the input data, for example, in synchronization with the timing when the input data is received, and sends it to a subsequent-stage latch circuit 11₂ and to an input reliability calculation section 12. The latch circuit 11₂ and a latch circuit 11₃ latch the data output from the previous-stage latch circuits 11₁, and 11₂, and send it to the subsequent-stage latch circuits 11₃ and 11₄ respectively, and to the input reliability calculation section 12, in the same way as the latch circuit 11₁. The latch circuit 11₄ latches the data output from the previous-stage latch circuit 11₃ and sends it to the input reliability calculation section 12.

The input reliability calculation section 12 receives the same input data as that sent to the latch circuit 11₁, in addition to the input data latched by the latch circuits 11₁ to 11₄. Therefore, when input data x(t) is sent to the latch circuit 11₁ and to the input reliability calculation section 12, the input reliability calculation section 12 also receives input data x(t−1) to x(t−4) latched by the latch circuits 11₁ to 11₄. The input reliability calculation circuit 12 calculates, for example, the dispersion of input data from the input data x(t) to x(t−4), and sends the reciprocal of the dispersion as the reliability $\alpha_{x(t)}$, namely, the input reliability, of the input data x(t) to an output reliability calculation section 13 and to a weight calculation section 15.

The output reliability calculation section 13 obtains the reliability $\alpha_{y(t)}$, namely, the output reliability of the output data y(t) according to the expression (4) with the use of the input reliability $\alpha_{x(t)}$ sent from the input reliability calculation section 12 and the output of a latch circuit 14, and outputs it to the latch circuit 14.

The latch circuit 14 latches the output reliability $\alpha_{y(t)}$ sent from the output reliability calculation section 13, for example, in synchronization with latching of the input data x(t), and sends it to the output reliability calculation section 13 and the weight calculation section 15. Therefore, the latch circuit 14 sends the output reliability $\alpha_{y(t-1)}$ obtained one sample before, to the output reliability calculation section 13 and the weight calculation section 15.

The weight calculation section 15 obtains a weight w(t) according to the expression (5) with the use of the input reliability $\alpha_{x(t)}$ sent from the input reliability calculation section 12 and the output reliability $\alpha_{y(t-1)}$ sent from the latch circuit 14, and sends it to a weighting section 21 and an operation section 22.

The latch circuits $11_1$ to $11_4$ the input reliability calculation section 12, the output reliability calculation section 13, the latch circuit 14, and the weight calculation section 15, described above, correspond to the real-time learning section shown in FIG. 1.

The weighting section 21 multiplies the weight w(t) sent from the weight calculation section 15 by the output of a latch circuit 25, and sends the product to an operation section 24. The operation section 22 subtracts the weight w(t) sent from the weight calculation section 15, from one, and sends the subtraction result, 1−w(t), to a weighting section 23. The weighting section 23 receives the input data x(t) as well as the output of the operation section 22. The weighting section 23 multiplies the input data x(t) by the output of the operation section 22, and sends the product to the operation section 24. The operation section 24 adds the outputs of the weighting sections 21 and 23, outputs the sum as output data y(t), and sends it to the latch circuit 25. The latch circuit 25 latches the output data of the operation section 24, for example, in synchronization with latching of the input data x(t), and sends it to the weighting section 21.

The weighting section 21, the operation section 22, the weighting section 23, the operation section 24, and the latch circuit 25, described above, correspond to the signal processing section 2 shown in FIG. 1, and calculate the weighted average according to the expression (7) and outputs it as the output data y(t).

Figure 8:
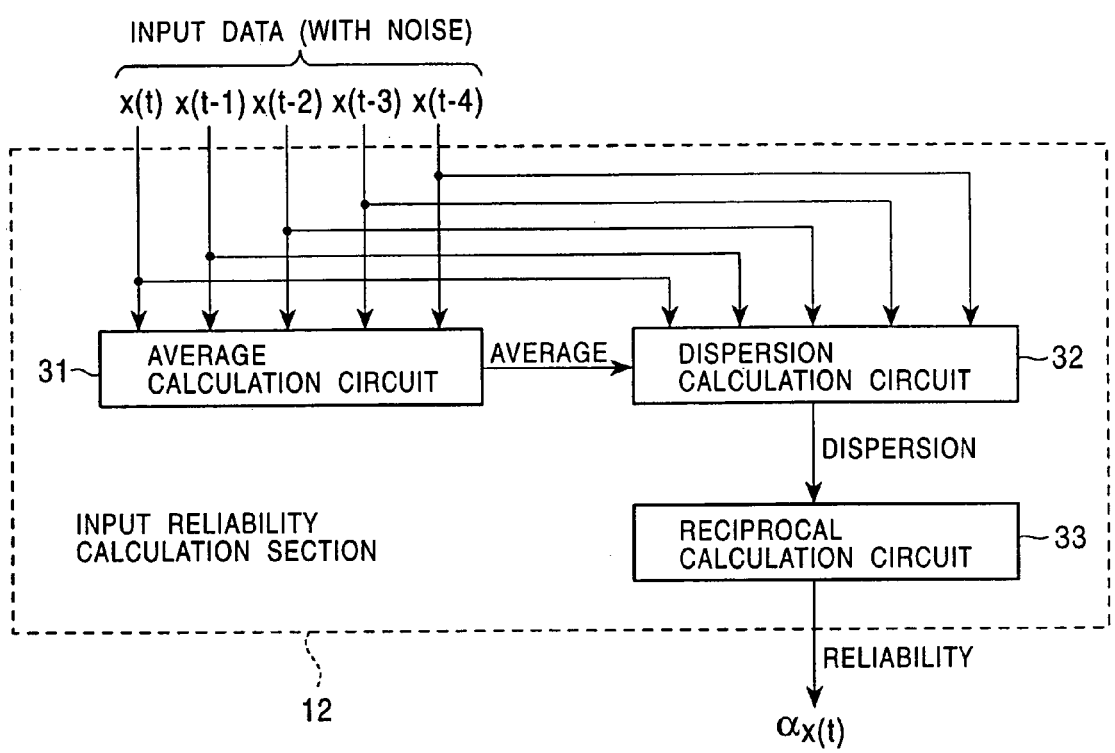
FIG. 8 is a block diagram showing an example structure of an input reliability calculation section 12 shown in FIG. 7.

FIG. 8 shows an example structure of the input reliability calculation section 12 shown in FIG. 7.

Figure 9:
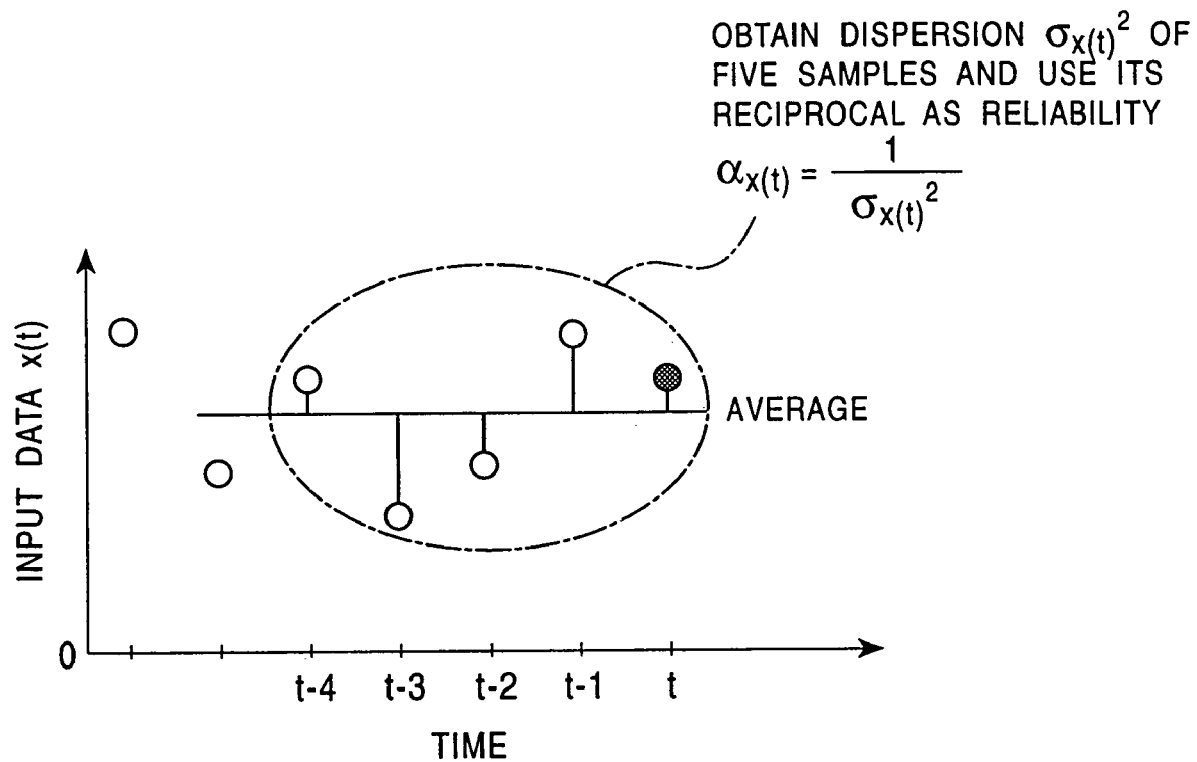
FIG. 9 is a view showing the processing of the input reliability calculation section 12 shown in FIG. 8.

As described above, the input reliability calculation section 12 receives the current input data x(t) and, in addition, the input data x(t−1) to x(t−4), up to four samples before the current one. The input reliability calculation section 12 obtains the dispersion of the five-sample input data x(t) to x(t−4) as shown in FIG. 9, and outputs the reciprocal of the dispersion as the input reliability $\alpha_{x(t)}$.

Specifically, the input data x(t) to x(t−4) is sent to an average calculation circuit 31 and to a dispersion calculation circuit 32. The average calculation circuit 31 calculates the average m(t) of the five-sample input data x(t) to x(t−4) according to the following expression and sends the result to the dispersion calculation circuit 32.

$$m(t) = \frac{\sum_{n=0}^{N-1} x(t-n)}{N} \quad (12)$$

In the embodiment shown in FIG. 8, N equals 5 in the expression (12).

The dispersion calculation circuit 32 uses the input data x(t) to x(t−4) input thereto and the average m(t) sent from the average calculation circuit 31 to calculate the dispersion $\sigma_{x(t)}^2$ according to an expression (13) and sends it to a reciprocal calculation circuit 33.

$$\sigma_{x(t)}^2 = \frac{\sum_{n=0}^{N-1} (x(t-n) - m(t))^2}{N} \quad (13)$$

In the same way as in the expression (12), N also equals 5 in the expression (13) in the embodiment shown in FIG. 8.

The reciprocal calculation circuit 33 obtains the reciprocal of the dispersion $\sigma_{x(t)}^2$ sent from the dispersion calculation circuit 32, and outputs it as the input reliability $\alpha_{x(t)}$.

$$\alpha_{x(t)} = \frac{1}{\sigma_{x(t)}^2} \quad (14)$$

FIG. 10 shows an example structure of the output reliability calculation section 13 shown in FIG. 7.

As shown in the figure, the output reliability calculation section 13 is formed of an operation section 41. The operation section 41 receives the current input reliability $\alpha_{x(t)}$ sent from the input reliability calculation section 12 and the output reliability $\alpha_{y(t-1)}$ obtained one sample before, sent from the latch circuit 14. The operation section 41 adds the input reliability $\alpha_{x(t)}$ and the output reliability $\alpha_{y(t-1)}$ according to the expression (4) and outputs the sum as the current output reliability $\alpha_{y(t)}$.

The operation of the NR processing circuit 100 shown in FIG. 7 will be described below by referring to FIGS. 11A and 11B and FIG. 12. The operation of the NR processing circuit 100 and the control of each functional block are implemented by a controller not shown. Alternatively, the whole NR processing algorithm may be implemented by software.

As shown in FIG. 11A, the NR processing circuit 100 uses five samples, the current input data x(t) and the input data x(t−1) to x(t−4) obtained up to four samples before the current one, to obtain the dispersion $\sigma_{x(t)}^2$ thereof, and further obtains the reciprocal of the dispersion as input reliability $\alpha_{x(t)}$.

The weight w(t) as well as the reliability $\alpha_{y(t)}$ of the current output data is obtained as shown in FIG. 11B with the use of the input reliability $\alpha_{x(t)}$ and the output reliability $\alpha_{y(t-1)}$ obtained one sample before, and the weighted average of the input data x(t) and the output data y(t−1) obtained one sample before is calculated according to the weight w(t) to output the weighted average as the output data y(t). With the above processing, $\alpha_{y(t)}$ and $\sigma_{x(t)}^2$ are obtained in this order as shown in FIG. 11B.

Figure 12:
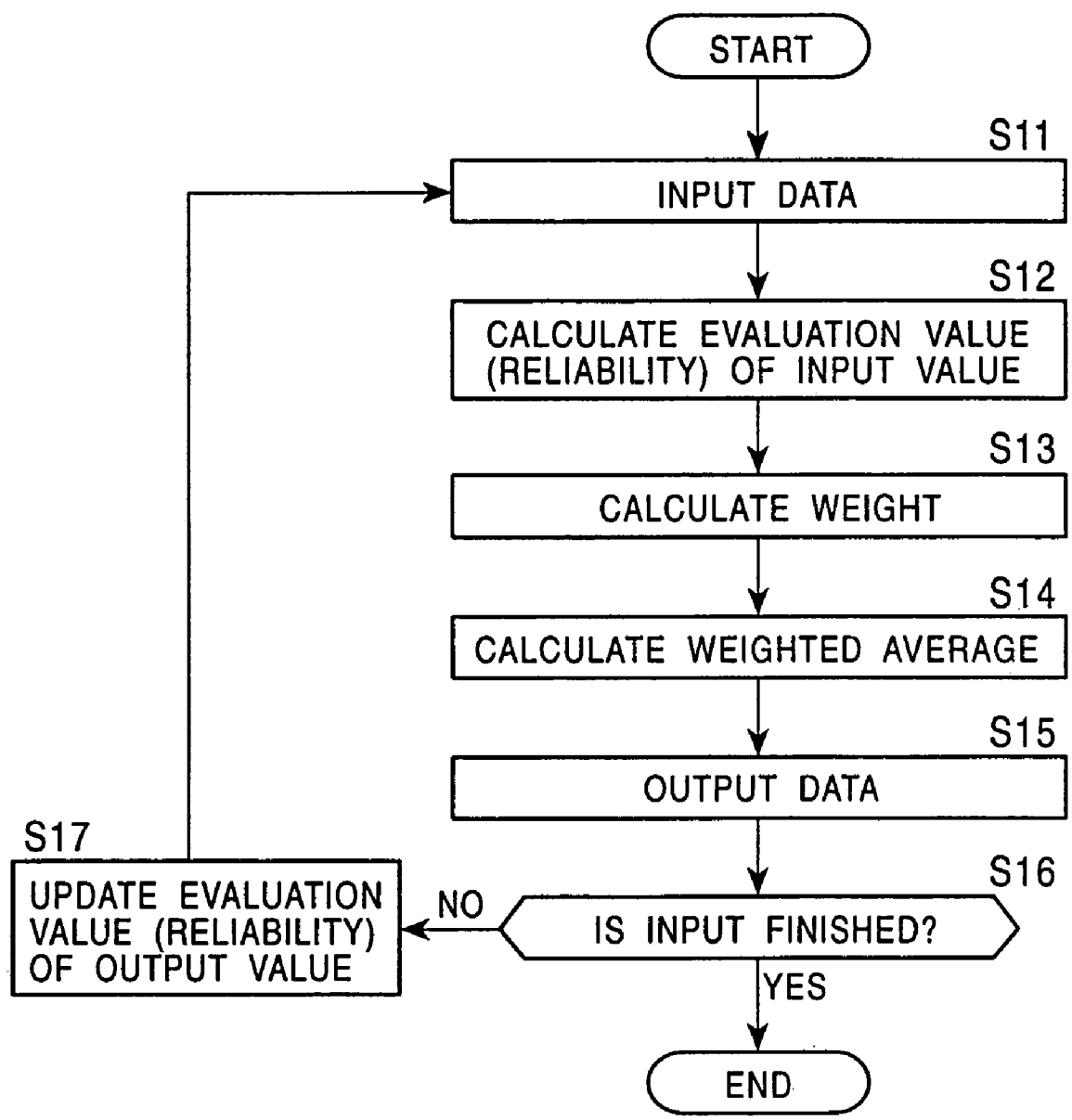
FIG. 12 is a flowchart showing the processing of the NR processing circuit shown in FIG. 7.

More specifically, as shown in a flowchart of FIG. 12, the input data x(t) is input to the latch circuit $11_1$, the input reliability calculation section 12, and the weighting section 23 in a step S11.

In the next step S12, the input reliability calculation section 12 obtains the input reliability $\alpha_{x(t)}$.

More specifically, the latch circuit 111 latches the received input data in synchronization with the timing when the input data is received, and sends it to the subsequent-stage latch circuit $11_2$ and to the input reliability calculation section 12. The latch circuit $11_2$ and the latch circuit $11_3$ latch the input data output from the previous-stage latch circuits $11_1$ and $11_2$ and send the data to the subsequent-stage latch circuits $11_3$ and $11_4$ and to the input reliability calculation section 12, respectively, in the same way as the latch circuit $11_1$. The latch circuit $11_4$ latches the input data output from the previous-stage latch circuit $11_3$ and sends it to the input reliability calculation section 12. Therefore, the input reliability calculation section 12 receives the input data x(t-1) to x(t-4) from the latch circuits $11_1$ to $11_4$ respectively, at the same time when it receives the input data x(t). The input reliability calculation section 12 uses the input data x(t) to x(t-4) to obtain the input reliability $\alpha_{x(t)}$ and sends it to the output reliability calculation section 13 and to the weight calculation section 15, as described above.

At the timing when the input reliability calculation section 12 sends the input reliability $\alpha_{x(t)}$ to the weight calculation section 15, the latch circuit 14 latches the output reliability $\alpha_{y(t-1)}$ output from the output reliability calculation section 13 one sample before. In a step S13, the weight calculation section 15 uses the input reliability $\alpha_{x(t)}$ sent from the input reliability calculation section 12 and the output reliability $\alpha_{y(t-1)}$ latched by the latch circuit 14 to obtain the weight w(t) according to the expression (5). This weight w(t) is sent to the weighting section 21 and the operation section 22.

The weighting section 21, the operation section 22, the weighting section 23, the operation section 24, and the latch circuit 25 use the weight w(t) output from the weight calculation section 15 to calculate the weighted average of the input data x(t) and the output data y(t-1) obtained one sample before, according to the expression (7).

Specifically, the weighting section 21 multiplies the output of the latch circuit 25 by the weight w(t) sent from the weight calculation section 15, and sends the product to the operation section 24. The latch circuit 25 latches the output data y(t-1) which the operation section 24 outputs the last time, at the timing when the weight calculation section 15 outputs the weight w(t). Therefore, the weighting section 21 obtains the product w(t)y(t-1) of the output data y(t-1) and the weight w(t) and sends it to the operation section 24.

The operation section 22 subtracts the weight w(t) sent from the weight calculation section 15, from one, and sends the subtraction value, 1-w(t), to the weighting section 23. The weighting section 23 multiplies the output, 1-w(t), of the operation section 22 by the input data x(t) and sends the multiplication result, (1-w(t))x(t), to the operation section 24.

The operation section 24 adds the output, w(t)y(t-1), of the weighting section 21 and the output, (1-w(t))x(t), of the weighting section 23. In other words, with the use of the weight w(t) output from the weight calculation section 15, the weighted average of the input data x(t) and the output data y(t-1) obtained one sample before is calculated according to the expression (7).

This weighted average is output as the output data y(t) in a step S15. The output data y(t) is sent to the latch circuit 25 and latched.

In the next step S16, the controller determines whether input data still exists. When it is determined in the step S16 that input data to be processed still exists, the procedure proceeds to a step S17 and the output reliability calculation section 13 updates the output reliability. Specifically, the output reliability calculation section 13 adds the input reliability $\alpha_{x(t)}$ calculated in the step S12 by the input reliability calculation section 12 and the output reliability $\alpha_{y(t-1)}$ obtained one sample before and latched by the latch circuit 14, according to the expression (4) to obtain the current output reliability $\alpha_{y(t)}$, and sends it to the latch circuit 14. Then, the procedure returns to the step S11, and the same processing is repeated with the next input data.

On the other hand, when the controller determines in the step S16 that input data to be processed does not exist, the processing is terminated.

As described above, the input reliability $\alpha_{x(t)}$ of the current input data x(t) and the output reliability $\alpha_{y(t-1)}$ obtained one sample before are added to calculate the weight w(t). Then, according to the weight w(t), the weighted average of the current input data x(t) and the output data y(t-1) obtained one sample before is calculated, and the average is output as the output data y(t) serving as the processing result of the input data x(t). The output reliability $\alpha_{y(t)}$ of the output data y(t) is then obtained by adding the current input reliability $\alpha_{x(t)}$ to the output reliability $\alpha_{y(t-1)}$ obtained one sample before. In the same way, input data x(t+1), x(t+2), . . . is sequentially processed. Therefore, the weight w(t) is learned such that portions having high noise levels are not much taken into account and portions having low noise levels are sufficiently taken into account in previous input data. In other words, the NR processing circuit 100 obtains a weight w(t) adaptive to input data, and as a result, improves the output data every moment as learning of the weight w(t) proceeds. The NR processing circuit 100 effectively removes noise from the input data and outputs data.

Since the NR processing circuit 100 uses the five-sample input data x(t) to x(t-4) to obtain the dispersion $\sigma_{x(t)}^2$ in the embodiment shown in FIG. 7, the input reliability $\alpha_{x(t)}$, which is the reciprocal of the dispersion, cannot be obtained until the time required for obtaining five samples elapses from the start of the data input. Until the time required for obtaining five samples elapses, the NR processing circuit 100 may execute the processing, for example, in a way in which neither input reliability nor output reliability is calculated and the simple average of input data which has been input is obtained and output as output data. A processing method used immediately after the data input is started is not limited to this method.

In the above-described case, since the NR processing circuit 100 uses the reciprocal of the dispersion of input data as the input reliability $\alpha_{x(t)}$, the input reliability $\alpha_{x(t)}$ indicates the scatter of the input data within a predetermined time range. Therefore, when the degree of noise included in input data, for example, the S/N ratio of the input data, varies, the NR processing circuit 100 very effectively removes the noise.

When the reciprocal of the dispersion of the input data is used as the input reliability $\alpha_{x(t)}$ in the NR processing circuit 100, however, the effect of noise removal is slightly lowered for a local change of a noise level, namely, a change in a very narrow area, due to the nature of the dispersion.

The local change of a noise level can be effectively handled by using, for example, the reciprocal of the error square of the current input data against the average of input data, as the input reliability $\alpha_{x(t)}$.

In this case, the input reliability $\alpha_{x(t)}$ is calculated in the following way.

Figure 13:
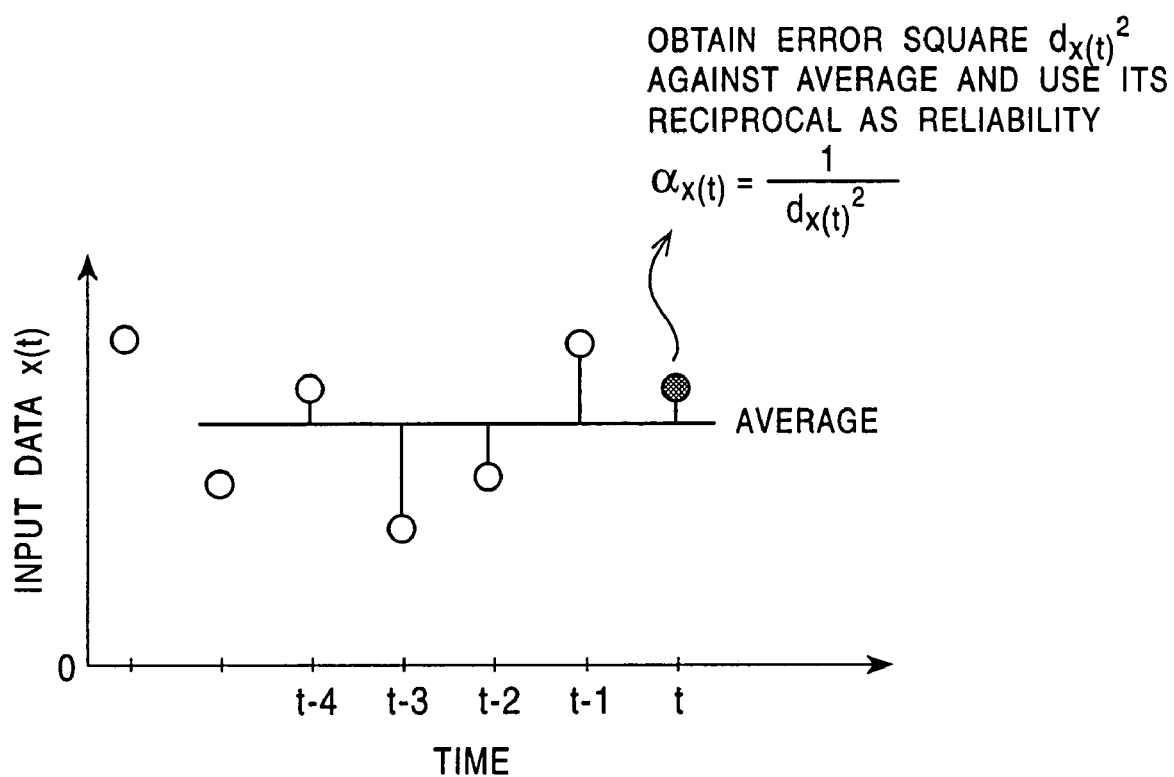
FIG. 13 is a view showing an input-reliability calculation method.

Specifically, for example, the NR processing circuit 100 calculates the average m(t) of five-sample input data x(t) to x(t−4) according to an expression (15) as shown in FIG. 13.

$$m(t) = \frac{\sum_{n=0}^{N-1} x(t-n)}{N} \quad (15)$$

In an embodiment shown in FIG. 13, N equals 5 in the expression (15).

With the use of the input data x(t) and the average m(t), the NR processing circuit 100 calculates an error square $d_{x(t)}^2$ of the input data x(t) against the average m(t) according to an expression (16).

$$d_{x(t)}^2 = (x(t) - m(t))^2 \quad (16)$$

Then, the reciprocal of the error square $d_{x(t)}^2$ is obtained according to the following expression to obtain the input reliability $\alpha_{x(t)}$.

$$\alpha_{x(t)} = \frac{1}{d_{x(t)}^2} \quad (17)$$

As described above, the method using the reciprocal of the error square as the input reliability $\alpha_{x(t)}$ is especially effective when the average m(t) is close to the true value.

In the above description, the input reliability $\alpha_{x(t)}$ is obtained based on either the dispersion $\sigma_{x(t)}^2$ or the error square $d_{x(t)}^2$. It can be also obtained based on both. Specifically, for example, the sum of the reciprocal of the dispersion $\sigma_{x(t)}^2$ and the reciprocal of the error square $d_{x(t)}^2$ can be used as an input reliability $\alpha_{x(t)}$.

Since the dispersion $\sigma_{x(t)}^2$ indicates the degree of the local scatters of input data in a rather wide area and the error square $d_{x(t)}^2$ indicates the degree of the local scatters of the data in a narrow area, when a combination of these factors is used as the input reliability $\alpha_{x(t)}$, even if the input data has a changing S/N ratio in a rather wide range and a local level of noise included in the input data also changes, the noise is effectively removed.

Figure 14:
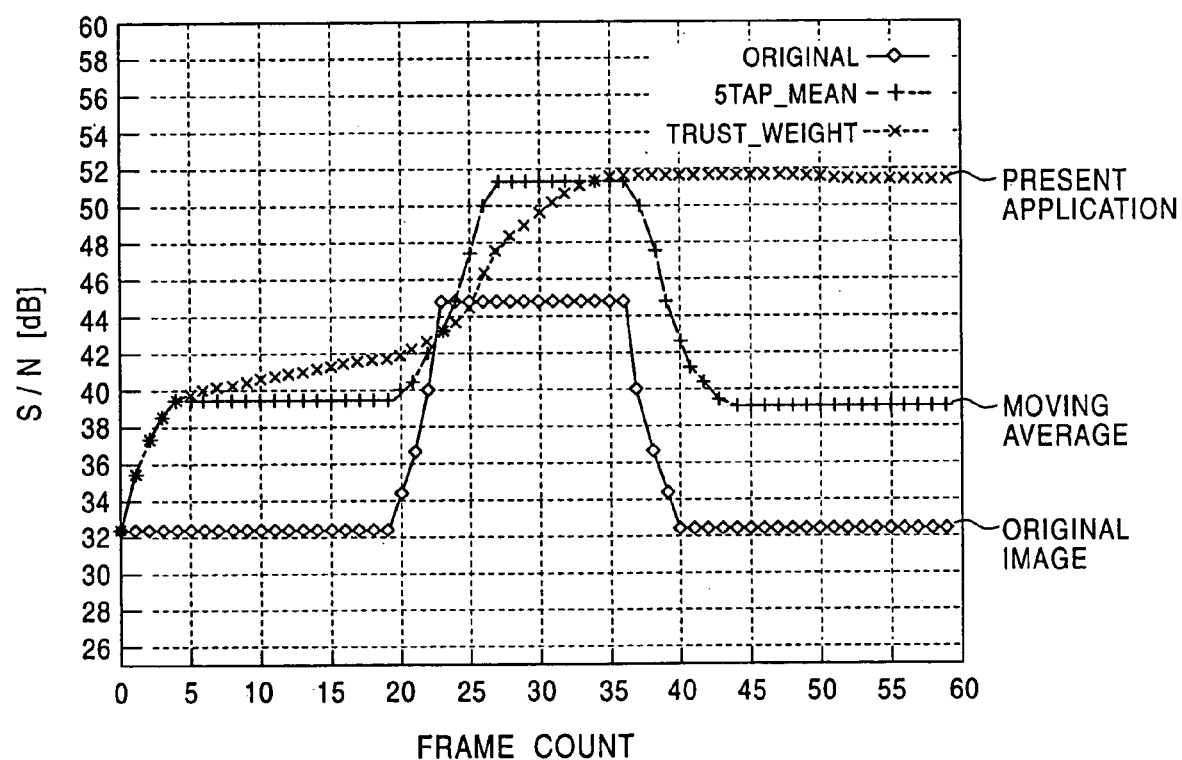
FIG. 14 is a view showing a simulation result of the NR processing circuit shown in FIG. 7.

FIG. 14 shows a simulation result of self-tuning processing in which image input data is processed with its dispersion $\sigma_{x(t)}^2$ being used as an input reliability $\alpha_{x(t)}$.

In FIG. 14, the horizontal axis and the vertical axis indicate a frame count or a frame number and an S/N ratio, respectively. The S/N ratios of input image data are indicated by ◇ marks. The S/N ratios of output data obtained by the moving-average method are indicated by + marks, and the S/N ratios of output data obtained by a method according to the present invention are indicated by x marks. Five samples are used to calculate the moving average and the input reliability $\alpha_{x(t)}$.

As clearly understood from FIG. 14, the S/N ratio of the output data obtained by the moving-average method tracks the S/N ratio of the input image data. Therefore, when the S/N ratio of the image data increases, that of the output data also increases, and when the S/N ratio of the image data decreases, that of the output data also decreases. In contrast, the S/N ratio of the output data obtained by the method according to the present invention increases every moment due to the effect of learning of the weight w(t), and it is almost not subject to a change in the S/N ratio of the image data.

The present invention can also be applied to a case in which noise is removed, for example, from sound data, in addition to image data.

The above embodiment has been described in the viewpoint of noise reduction. Since the NR processing circuit 100 learns a processing method, the weight coefficient w(t) in this case, in real time and executes the processing by the processing method obtained as a result of the learning, such that input data is adaptively processed to improve output data as time elapses, the NR processing circuit 100 has a nature of self-tuning processing in which the input data itself is adaptively processed. In other words, the NR processing circuit can execute, for example, most-appropriate waveform shaping of input data.

In the present embodiment, the output data y(t−1) is multiplied by the weight w(t) and the input data x(t) is multiplied by the weight, 1−w(t), in the expression (7) to obtain the output data y(t) in the NR processing circuit 100. It is also possible that either the output data y(t−1) or the input data x(t) is multiplied by a weight to obtain an output data y(t).

The series of processing shown in FIG. 12 can be implemented by hardware or software. When the series of processing is achieved by software, a program constituting the software is installed into a computer which is built in the NR processing circuit 100 serving as special hardware or into a general-purpose computer.

Recording media which store the program for executing the series of processing described above will be described below by referring to FIGS. 15A, 15B, and 15C. The program is installed into a computer and is made executable by the computer.

Figure 15A:
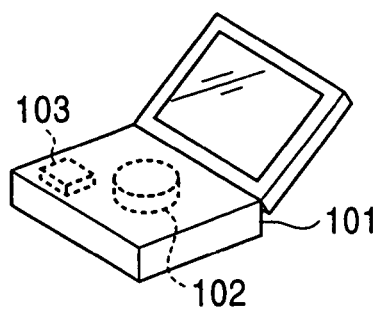
FIG. 15A is a view showing a computer into which a program for executing processing related to the present invention is installed.

The program is recorded in advance into a hard disk 102 or a semiconductor memory 103 serving as a recording medium which is built in a computer 101, as shown in FIG. 15A.

Figure 15B:
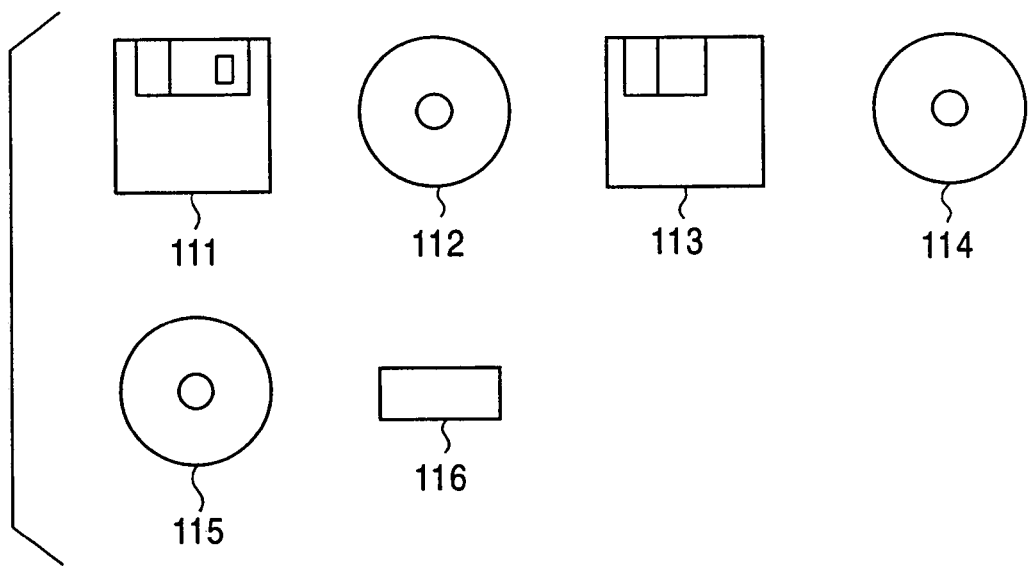
FIG. 15B is a view showing example storage media for storing the program which executes the processing related to the present invention.

Alternatively, the program is recorded temporarily or perpetually into recording media, such as a floppy disk 111, a compact disc read-only memory (CD-ROM) 112, a magneto-optical (MO) disk 113, a digital versatile disk (DVD) 114, a magnetic disk 115, and a semiconductor memory 116, as shown in FIG. 15B.

The program is installed in the computer from the above-described recording medium. Alternatively, the program is transferred by radio from a downloading site 121 to the computer 101 through an artificial satellite for digital satellite broadcasting, or to the computer 101 by wire through a network 131 such as a local area network (LAN) or the Internet; and is installed into the hard disk 102, built in the computer 101, as shown in FIG. 15C.

In the present specification, the steps describing the programs for executing various types of processing are not necessarily processed in a time sequential manner in the order in which the steps are described in the flowcharts. Processing to be executed in parallel or individually, such as parallel processing or processing by objects, is also included.

Figure 15C:
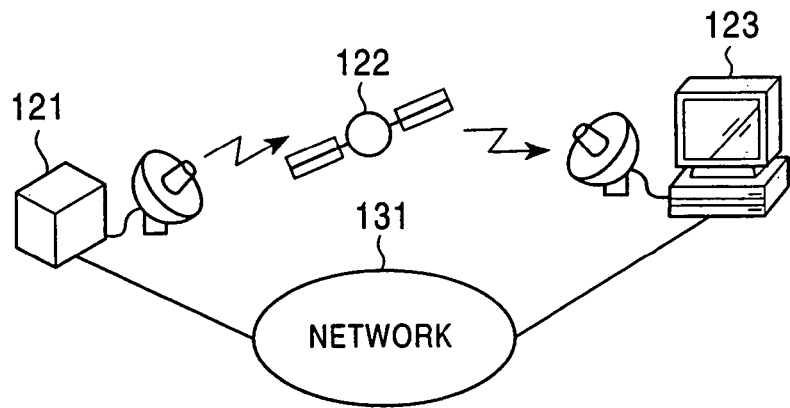
FIG. 15C is a view showing cases in which the program for executing the processing related to the present invention is distributed to the computer through a satellite and a network.
Figure 16:
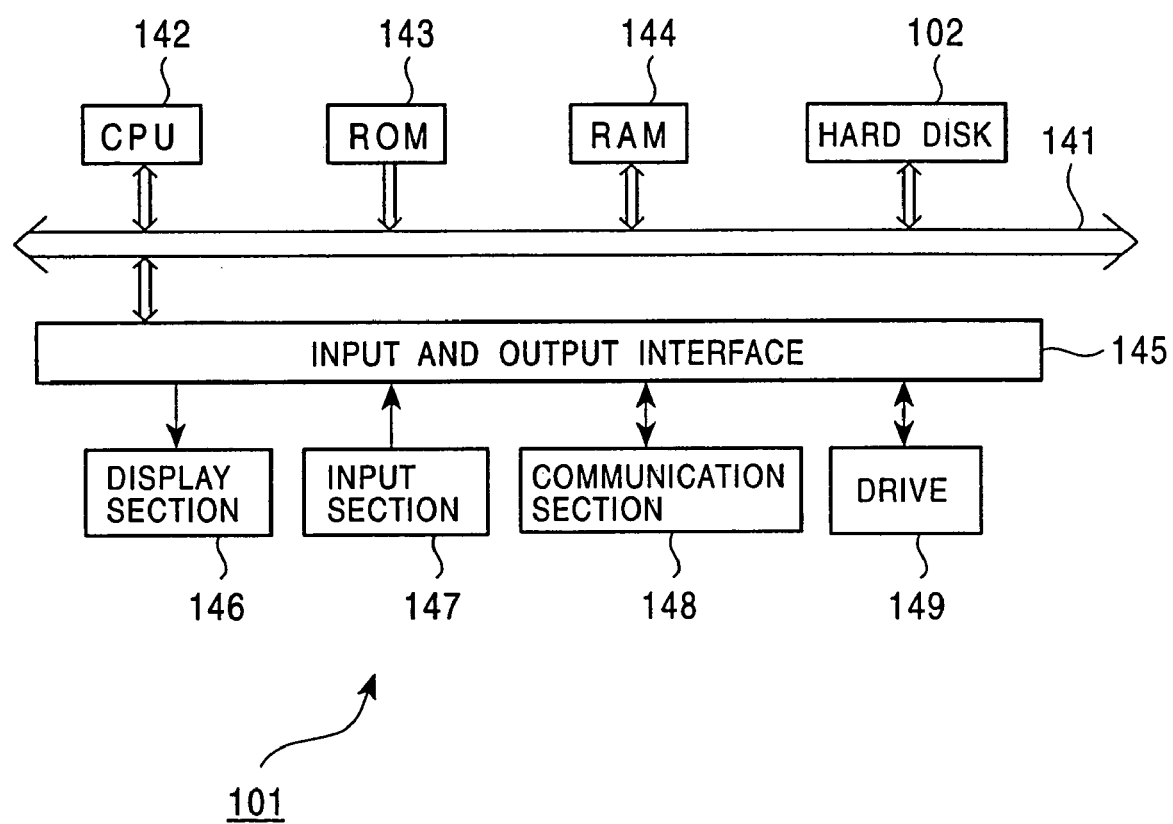
FIG. 16 is a block diagram of a computer into which the program for executing the processing related to the present invention is installed.

FIG. 16 shows an example structure of the computer 101 shown in FIGS. 15A, 15B, and 15C.

The computer 101 includes a central processing unit (CPU) 142, as shown in FIG. 16. The CPU 142 is connected to an input and output interface 145 through a bus 141. When the user operates an input section 147 formed of a keyboard and a mouse to input a command through the input and output interface 145, the CPU 142 executes a program stored in a read-only memory (ROM) 143 corresponding to the semiconductor memory 103 shown in FIG. 15A. Alternatively, the CPU 142 loads into a random access memory (RAM) 144 a program stored in the hard disk 102; a program transferred through the satellite 122 or the network 131, received by a communication section 148, and installed into the hard disk 102; or a program read from the floppy disk 111, the CD-ROM 112, the MO disk 113, the DVD 114, or the magnetic disk 115 which is loaded into a drive 149, and installed into the hard disk 102; and executes it. The CPU 142 outputs the processing result, for example, through the input and output interface 145 to a display section 146 formed of a liquid-crystal display (LCD), as required.

What is claimed is:

1. A data processing apparatus for processing input data to create processed data for outputting, comprising:
    a data processor for processing the input data by predetermined processing and outputting the processed data as output data;
    an input data evaluator configured to evaluate the input data and calculate a reliability of the input data;
    an output data evaluator configured to evaluate the output data and calculate a reliability of the output data, and
    a real time learning portion consisting of a single component configured to learn the processing of the data processor in real time using the reliability of the input data calculated by said input data evaluator and the reliability of the output data calculated by said output data evaluator to create learned processing and control the data processor to process the input data according to the learned processing.

2. A data processing apparatus according to claim 1, further comprising an input data storage unit for storing a predetermined number of time-sequentially input data.

3. A data processing apparatus according to claim 2, wherein said input data evaluator calculates a dispersion of the predetermined number of the time-sequentially input data stored by said input data storage unit and evaluates current input data according to the dispersion.

4. A data processing apparatus according to claim 2, wherein said input data evaluator calculates an average of the predetermined number of the time-sequentially input data stored by said input data storage unit, and evaluates current input data according to an error of each of the input data against the average.

5. A data processing apparatus according to claim 2, wherein said input data evaluator calculates a dispersion and an average of the predetermined number of the time-sequentially input data stored by said input data storage unit; obtains an error of each input data against the average; and evaluates current input data according to the dispersion and a respective error.

6. A data processing apparatus according to claim 1, further comprising an output data storage unit for storing the output data, wherein said data processor adds previous output data stored by said output data storage unit and current input data to obtain the output data corresponding to the current input data.

7. A data processing apparatus according to claim 6, wherein said real time learning portion learns a predetermined weight coefficient according to the reliability of the input data and the reliability of the output data, and
    said data processor obtains the output data corresponding to the current input data according to the weight coefficient.

8. A data processing method for processing input data and creating processed data for outputting comprising the steps of:
    processing the input data by a predetermined processing method and outputting the processed data as output data;
    evaluating the input data and calculating a reliability of the input data; evaluating the output data and calculating a reliability of the output data, and
    learning the step of processing the input data in real time in a single component using the calculated reliability of the input data and the calculated reliability of the output data to create a learned processing and the input data is processed by the step of processing the input data by the learned processing.

9. A data processing method according to claim 8, further comprising an input data storing step of storing a predetermined number of time-sequentially input data.

10. A data processing method according to claim 9, wherein, in the step of evaluating the input data, a dispersion of the predetermined number of the time-sequentially input data stored in the input data storing step is calculated and current input data is evaluated according to the dispersion.

11. A data processing method according to claim 9, wherein, in the step of evaluating the input data, an average of the predetermined number of the time-sequentially input data stored in the input data storing step is calculated, and current input data is evaluated according to an error of each input data against the average.

12. A data processing method according to claim 9, wherein, in the step of evaluating the input data, a dispersion and an average of the predetermined number of the input data stored in the input data storing step are calculated; an error of each input data against the average is obtained; and current input data is evaluated according to the dispersion and a respective error.

13. A data processing method according to claim 8, further comprising an output data storing step of storing the output data, wherein, in the step of processing the input data, previous output data stored in the output data storing step and current input data are added to obtain the output data corresponding to the current input data.

14. A data processing method according to claim 13, wherein a predetermined weight coefficient is learned according to the reliability of the input data and the reliability of the output data in the step of learning, and
    the output data corresponding to the current input data is obtained according to the weight coefficient in the step of processing the input data.

15. A storage medium storing a computer-controllable program for processing input data and creating processed data for outputting the program comprising the steps of:
    processing the input data by a predetermined processing and outputting the processed data as output data;
    evaluating the input data and calculating a reliability of the input data;
    evaluating the output data and calculating a reliability of the output data, and
    learning the step of processing the input data in real time in a single component using the calculated reliability of the input data and the calculated reliability of the output data to create a learned processing, and the input data is processed by the step of processing the input data by the learned processing.

* * * * *